(12) United States Patent
Xie et al.

(10) Patent No.: US 11,011,734 B2
(45) Date of Patent: May 18, 2021

(54) MANUFACTURING METHOD FOR FLEXIBLE DISPLAY PANEL AND FLEXIBLE DISPLAY DEVICE

(71) Applicant: BOE TECHNOLOGY GROUP CO., LTD., Beijing (CN)

(72) Inventors: Chunyan Xie, Beijing (CN); Paoming Tsai, Beijing (CN); Song Zhang, Beijing (CN); Penghao Gu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 23 days.

(21) Appl. No.: 16/419,605

(22) Filed: May 22, 2019

(65) Prior Publication Data

US 2020/0028123 A1     Jan. 23, 2020

(30) Foreign Application Priority Data

Jul. 18, 2018    (CN) .......................... 201810790777.0

(51) Int. Cl.
    *H01L 51/56*         (2006.01)
    *H01L 51/00*         (2006.01)
    (Continued)

(52) U.S. Cl.
    CPC ................ *H01L 51/56* (2013.01); *B32B 3/04* (2013.01); *B32B 7/12* (2013.01); *B32B 27/08* (2013.01);
    (Continued)

(58) Field of Classification Search
    CPC ............. H01L 51/0097; H01L 27/3244; H01L 51/5281; H01L 51/56; H01L 51/003; B32B 17/064; B32B 7/12
    See application file for complete search history.

(56) References Cited

U.S. PATENT DOCUMENTS

| | | | |
|---|---|---|---|
| 10,177,327 | B2 | 1/2019 | Jung et al. |
| 10,519,348 | B2 | 12/2019 | Mase |

(Continued)

FOREIGN PATENT DOCUMENTS

| | | |
|---|---|---|
| CN | 104603219 A | 5/2015 |
| CN | 205303466 U | 6/2016 |

(Continued)

OTHER PUBLICATIONS

First Office Action dated Mar. 10, 2020 for corresponding Chinese application 201810790777.0.

*Primary Examiner* — Michael Jung
(74) *Attorney, Agent, or Firm* — Nath, Goldberg & Meyer; Joshua B. Goldberg (57) ABSTRACT

A flexible display panel and a method for manufacturing the same, and a flexible display device and a method for manufacturing the same are provided. The method for manufacturing a flexible display panel according to the disclosure includes: forming an adhesion-variable back film on a non-light-exiting surface of a flexible display substrate; cutting the adhesion-variable back film along a boundary of a to-be-removed region; removing the adhesion-variable back film in the to-be-removed region; and increasing adhesion of the adhesion-variable back film to obtain the flexible display panel.

14 Claims, 5 Drawing Sheets

(51) Int. Cl.
   *B32B 7/12*     (2006.01)
   *B32B 3/04*     (2006.01)
   *B32B 27/08*    (2006.01)
   *B32B 27/34*    (2006.01)
   *B32B 27/36*    (2006.01)
   *B32B 38/00*    (2006.01)
   *H01L 51/52*    (2006.01)
   *H01L 27/32*    (2006.01)

(52) U.S. Cl.
   CPC .............. *B32B 27/34* (2013.01); *B32B 27/36* (2013.01); *B32B 38/0004* (2013.01); *B32B 38/105* (2013.01); *H01L 51/003* (2013.01); *H01L 51/0097* (2013.01); *H01L 51/5281* (2013.01); *B32B 2457/206* (2013.01); *H01L 27/3244* (2013.01); *H01L 2251/5338* (2013.01); *H01L 2251/566* (2013.01)

(56) References Cited

U.S. PATENT DOCUMENTS

| | | | |
|---|---|---|---|
| 2017/0271616 A1 | 9/2017 | Choi et al. | |
| 2017/0278899 A1* | 9/2017 | Yang | H01L 51/56 |
| 2018/0076400 A1* | 3/2018 | Jung | B32B 27/308 |
| 2018/0182829 A1* | 6/2018 | Shin | H01L 51/56 |
| 2018/0212169 A1* | 7/2018 | Goto | H01L 51/5253 |
| 2020/0013987 A1* | 1/2020 | Lee | H01L 51/0097 |

FOREIGN PATENT DOCUMENTS

| | | |
|---|---|---|
| CN | 106710451 A | 5/2017 |
| CN | 106910428 A | 6/2017 |
| CN | 106910429 A | 6/2017 |
| CN | 106973549 A | 7/2017 |
| CN | 107195642 A | 9/2017 |
| CN | 107403882 A | 11/2017 |
| CN | 107819072 A | 3/2018 |
| EP | 3594928 A1 | 1/2020 |

\* cited by examiner

MANUFACTURING METHOD FOR FLEXIBLE DISPLAY PANEL AND FLEXIBLE DISPLAY DEVICE

CROSS-REFERENCE TO RELATED APPLICATIONS

This application claims the benefit of priority to Chinese Patent Application No. 201810790777.0, filed on Jul. 18, 2018, the contents of which are incorporated herein by reference in its entirety.

TECHNICAL FIELD

The present disclosure relates to the field of display technology, and in particular, to a flexible display panel and a manufacturing method thereof, and a flexible display device and a manufacturing method thereof.

BACKGROUND

Flexible display devices are bendable or deformable display devices having flexible display panels. Examples of the flexible display device include a flexible organic light-emitting diode (OLED) display device, a flexible electrophoretic display (EPD) device, and a flexible liquid-crystal display (LCD) device. As a new-generation display device, the flexible display devices have the advantages such as thinner thickness, lighter weight, high contrast, quick response, and high brightness. The flexible display devices also provide full color and wide viewing-angle display. The flexible display devices have been widely used in mobile phones, personal digital assistants (PDAs), digital cameras, in-vehicle displays, notebook computers, wall-mounted televisions, and various military applications. The flexible display devices with a narrow bezel have become an important research topic.

SUMMARY

According to an aspect of the disclosure, a method for manufacturing a flexible display panel is provided, and the method includes: forming an adhesion-variable back film on a non-light-exiting surface of a flexible display substrate; cutting the adhesion-variable back film along a boundary of a to-be-removed region; removing the adhesion-variable back film in the to-be-removed region; and increasing adhesion of the adhesion-variable back film to obtain the flexible display panel.

In an embodiment, the flexible display substrate includes at least one flexible display sub-substrate. The flexible display sub-substrate includes a display region, a bonding region, and a bending region between the display region and the bonding region. The bending region is a region to be bent of the flexible display sub-substrate. A portion of the flexible display sub-substrate overlapping with an orthogonal projection of the to-be-removed region on the flexible display sub-substrate coincides with the bending region of the flexible display sub-substrate.

In an embodiment, the adhesion-variable back film is made of a material which has increased adhesion as being heated. Increasing the adhesion of the adhesion-variable back film includes heating the adhesion-variable back film.

In an embodiment, the adhesion-variable back film is made of a material which has increased adhesion as being irradiated with particular light. Increasing the adhesion of the adhesion-variable back film includes irradiating the adhesion-variable back film with the particular light.

In an embodiment, each of a width of an end portion of the to-be-removed region is greater than a width of a portion of the to-be-removed region whose orthogonal projection on the flexible display sub-substrate overlaps with the flexible display sub-substrate.

In an embodiment, the flexible display substrate includes a plurality of flexible display sub-substrates, an orthogonal projection of the to-be-removed region on the flexible display substrate overlaps with at least two flexible display sub-substrates of the flexible display sub-substrates.

In an embodiment, the adhesion-variable back film includes a plurality of to-be-removed regions. Removing the adhesion-variable back film in the to-be-removed region includes simultaneously removing the adhesion-variable back film in the to-be-removed regions.

In an embodiment, simultaneously removing the adhesion-variable back film in the to-be-removed regions includes: adhering end portions, at a same side, of the adhesion-variable back film in the to-be-removed regions to a strip mechanical structure, and then simultaneously lifting up the end portions.

In an embodiment, after removing the adhesion-variable back film in the to-be-removed region and before increasing the adhesion of the adhesion-variable back film, the method further includes: adhering a lower protective film on a side of the adhesion-variable back film distal to the flexible display substrate.

In an embodiment, the method further includes forming an upper protective film on a light-exiting surface of the flexible display substrate.

In an embodiment, the upper protective film is beyond an edge of the flexible display substrate to be in contact with the adhesion-variable back film. Adhesion between the adhesion-variable back film and the flexible display substrate is greater than adhesion between the adhesion-variable back film and the upper protective film.

According to an aspect of the disclosure, a method for manufacturing a flexible display device is provided, and the method includes: manufacturing a flexible display panel according to the method described above; cutting the flexible display panel to obtain at least one flexible display sub-panel, each flexible display sub-panel including one flexible display sub-substrate and the adhesion-variable back film on the non-light-exiting surface of the flexible display sub-substrate; and bending the flexible display sub-substrate in the bending region of the flexible display sub-substrate, such that the bonding region of the flexible display sub-substrate is adhered on a non-light-exiting side of the display region of the flexible display sub-substrate.

In an embodiment, the method further includes: bonding a driving circuit in the bonding region of the flexible display sub-substrate; and adhering an upper functional film to a light-exiting surface of the flexible display sub-substrate in the display region.

In an embodiment, the upper functional film includes at least one of a polarizer and a touch substrate.

In an embodiment, a lower protective film is adhered on a side of the adhesion-variable back film distal to the flexible display sub-substrate. Bending the flexible display sub-substrate in the bending region of the flexible display sub-substrate such that the bonding region of the flexible display sub-substrate is adhered on the non-light-exiting side of the display region of the flexible display sub-substrate includes: removing the lower protective film; adhering a lower functional film on a side of the adhesion-variable back film distal to the flexible display sub-substrate, the lower functional film being in the display region of the flexible display sub-substrate and including a heat sink; and bending the flexible display sub-substrate in the bending region of the flexible display sub-substrate, such that the bonding region of the flexible display sub-substrate is adhered onto the lower functional film.

In an embodiment, an upper protective film is formed on the light-exiting surface of the flexible display sub-substrate. Before adhering the upper functional film to the light-exiting surface of the flexible display sub-substrate in the display region, the method further includes: removing the upper protective film.

According to an aspect of the disclosure, a flexible display panel is provided, and the flexible display panel includes a flexible display substrate and a back film formed on a non-light-exiting surface of the flexible display substrate, and the flexible display substrate includes at least one flexible display sub-substrate. The back film is made of an adhesion-variable material, and adhesion of the adhesion-variable material is changeable under external excitation.

In an embodiment, the adhesion-variable back film is made of one of a material which has increased adhesion as being heated, and a material which has increased adhesion as being irradiated with particular light.

In an embodiment, the flexible display sub-substrate includes a display region, a bonding region, and a bending region between the display region and the bonding region. The back film has a notch. An orthographic projection of the notch on the flexible display sub-substrate coincides with the bending region of the flexible display sub-substrate.

According to an aspect of the disclosure, a flexible display device is provided, and the flexible display device includes a flexible display sub-panel. The flexible display sub-panel is formed by cutting the above-described flexible display panel, and the flexible display sub-panel includes the flexible display sub-substrate and the back film formed on the non-light-exiting surface of the flexible display sub-substrate. The bonding region of the flexible display sub-substrate is adhered on a non-light-exiting side of the display region of the flexible display sub-substrate.

DETAILED DESCRIPTION

In order to enable those skilled in the art to better understand the technical solutions of the present disclosure, the present disclosure will be further described in detail below in conjunction with the drawings and specific embodiments.

In the related art, in the process of manufacturing a flexible display device having a narrow bezel, firstly a lower protective film (which is used for protecting a substrate in subsequent processes) is adhered to a non-light-exiting surface of the substrate (for example, a polyimide resin PI) of a flexible display substrate, and then the flexible display substrate is cut into flexible display sub-substrates. Each flexible display sub-substrate corresponds to one flexible display device for display. Each flexible display substrate may be cut into one or more flexible display sub-substrates. Each of the flexible display sub-substrates has a display region, a bending region, and a bonding region in sequence along a width direction or a length direction thereof. Then, the lower protective film is removed, and a back film having a notch is formed or adhered to the non-light-exiting surface of the flexible display sub-substrate. The notch corresponds to the bending region of the flexible display sub-substrate. The back film serves to support and protect the flexible display sub-substrate. In the subsequent manufacturing processes, the bending region of the flexible display sub-substrate can be bent, so that the bonding region is adhered on a non-light-exiting side of the display region, thereby reducing a size of the flexible display device when viewed from the front side.

The present disclosure provides a method for manufacturing a flexible display panel, which is capable of reducing a bezel of a flexible display device while having advantages such as simple manufacturing process, high manufacturing efficiency, and less equipment requirements.

Figure 1:
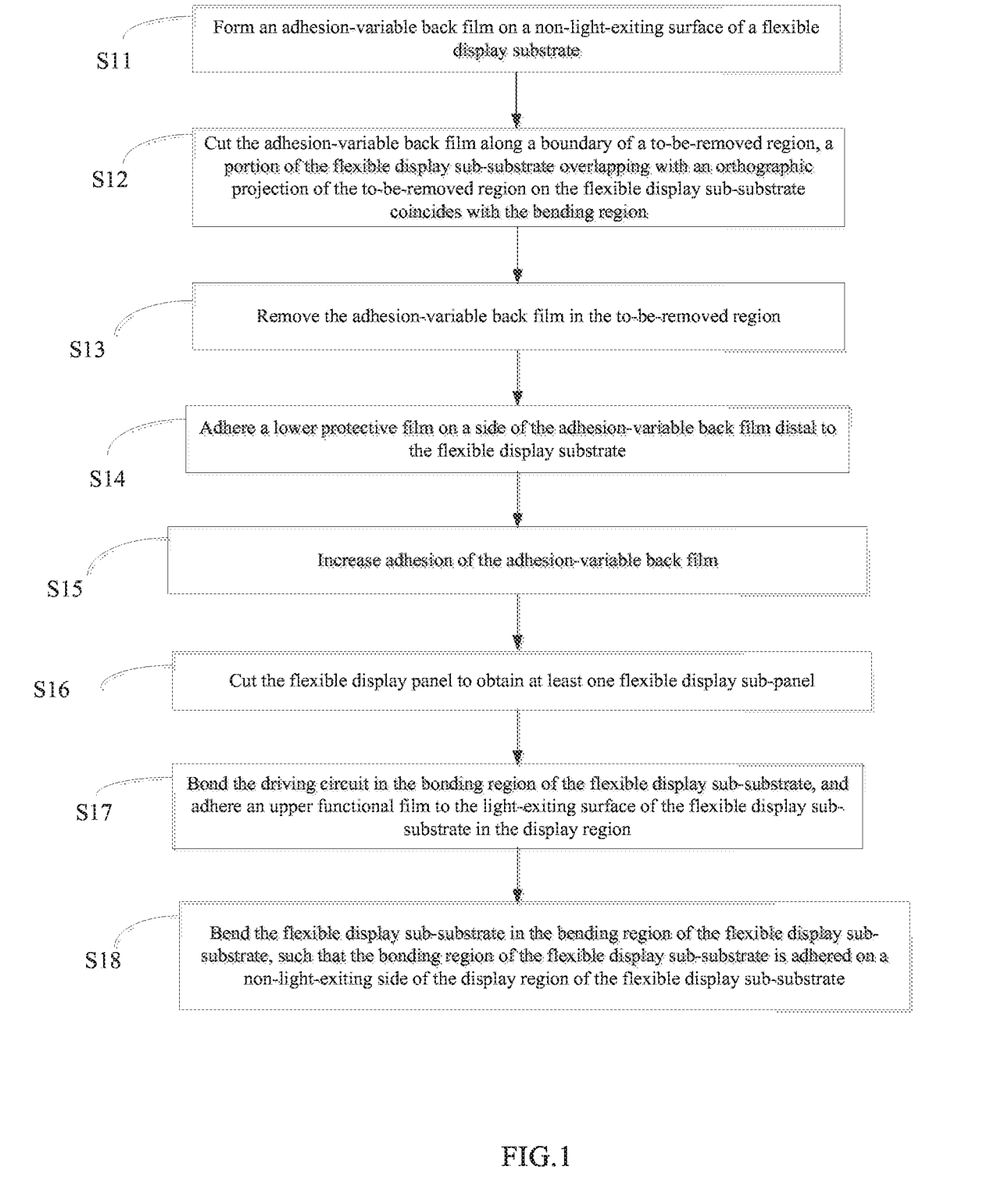
FIG. 1 is a flow chart showing a method for manufacturing a flexible display panel and a flexible display device according to an embodiment of the present disclosure.

First, a flexible display substrate is prepared. In an embodiment, a flexible substrate material is coated on a carrier, such as a glass carrier, and cured into a film, thus forming a flexible substrate of 5-30 um. The flexible substrate material is, for example, polyimide (PI). A barrier layer is then formed on the flexible substrate, and a material of the barrier layer is, for example, a Si—N compound or a Si—O compound, etc., and serves to enhance the water and oxygen resistance of the flexible substrate. A buffer layer is then formed on the barrier layer. An array of driving transistors (e.g., a TFT array) is then formed on the buffer layer. A layer of light-emitting elements is then formed on the array of driving transistors, and the light-emitting element may include, for example, an organic light-emitting diode (OLED). The driving transistor is configured to control a brightness of light emitted from the light-emitting element. A thin film encapsulation layer (TFE) is then formed on the layer of the light-emitting elements. At this point, the preparation of the flexible display substrate is finished. Afterwards, the manufacturing process for the flexible display panel starts. As shown in FIG. 1, a method for manufacturing the flexible display panel includes step 11 to step 15, and the flexible display panel during the manufacturing process is shown in FIG. 2 to FIG. 5.

Figure 3:
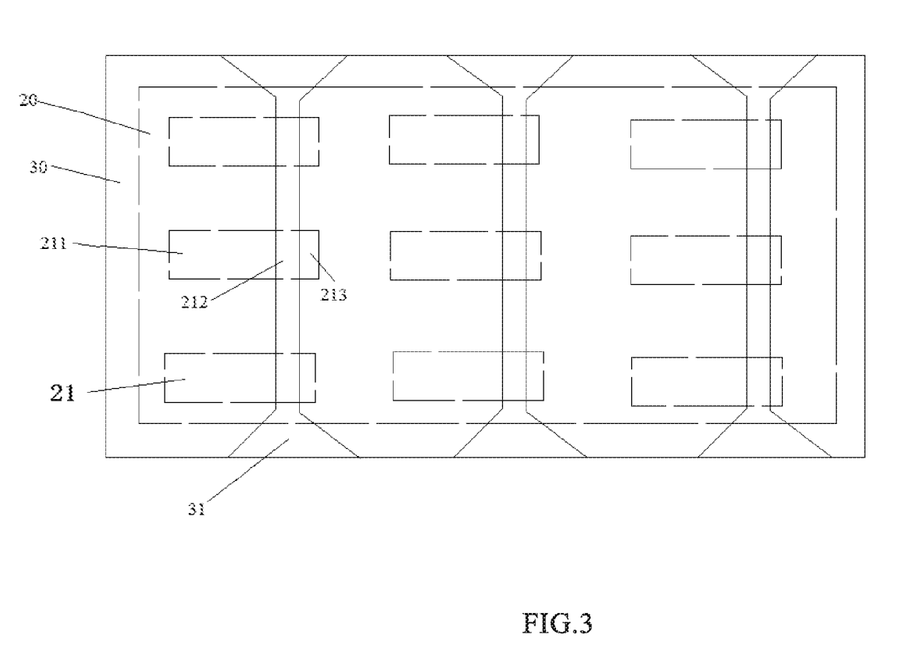
FIG. 3 is a plan view of a flexible display panel according to an embodiment of the present disclosure.

At step S11, an adhesion-variable back film 30 is formed on a non-light-exiting surface of a flexible display substrate 20, thus forming a semi-finished product of a flexible display panel. As shown in FIG. 3, the flexible display substrate 20 includes at least one flexible display sub-substrate 21. Each flexible display sub-substrate 21 includes a display region 211, a bending region 212, and a bonding region 213. The bending region 212 is between the display region 211 and the bonding region 213.

In an embodiment, one flexible display substrate 20 includes one or more flexible display sub-substrates 21. One flexible display substrate 20 can be cut into one or more flexible display sub-substrates 21 by a process such as cutting. As shown in FIG. 3, one flexible display substrate 20 includes nine flexible display sub-substrates 21 arranged in an array, so nine flexible display sub-substrates 21 can be obtained by cutting.

Figure 6:
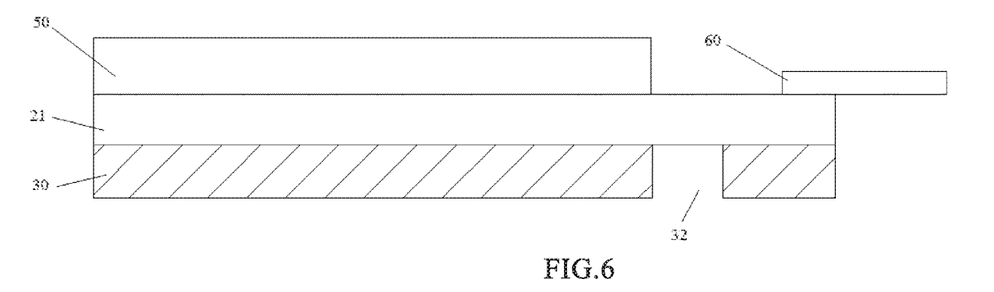
FIG. 6 is a diagram showing a state of a flexible display sub-panel before being bent, according to an embodiment of the present disclosure.
Figure 7:
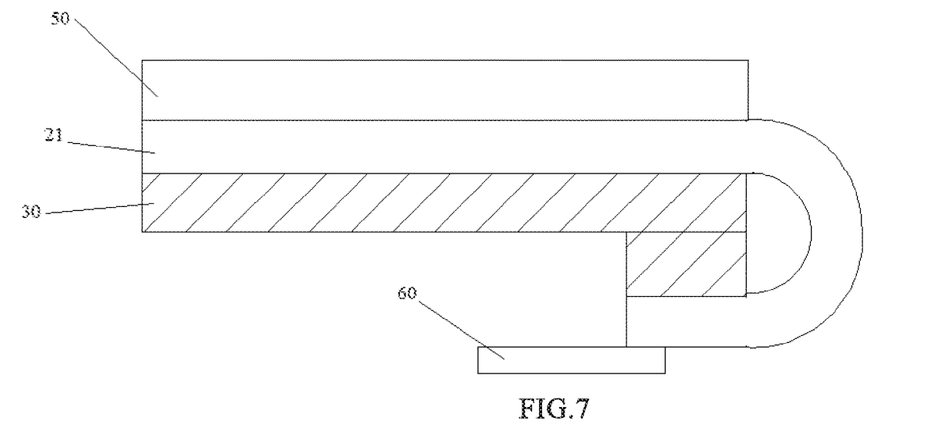
FIG. 7 is a diagram showing a state of the flexible display sub-panel shown in FIG. 6 after being bent.
Figure 8:
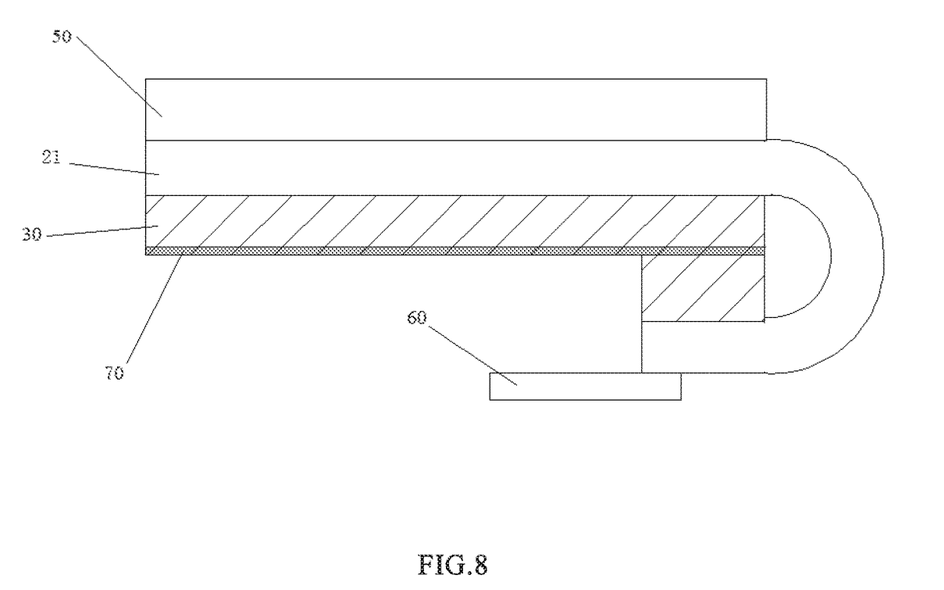
FIG. 8 is a diagram showing a state of the flexible display sub-panel after being bent according to an embodiment of the present disclosure.

Each of the flexible display sub-substrates 21 includes a display region 211, a bending region 212, and a bonding region 213. In an embodiment, the display region 211 includes an array of light emitting elements for display. The bending region 212 is bent in a subsequent process (as shown in FIG. 7 and FIG. 8) such that the bonding region 213 is adhered on the non-light-exiting side of the display region 211 (the side distal to a light-exiting surface of the display region 211). The bonding region 213 is configured to be bonded with the driving circuit 60 in a subsequent process (as shown in FIG. 6).

The adhesion-variable back film 30 has certain adhesion itself, and the adhesion of the adhesion-variable back film 30 is changeable under an external environment excitation. For example, the adhesion-variable back film 30 is made of a material which has increased adhesion when being heated, or a material which has increased adhesion when being irradiated by particular light (for example, UV light).

In an embodiment, the adhesion-variable back film 30 may include an adhesive material and a substrate material under the adhesive material. The substrate material typically may include PET, PEN, PI, or the like. The substrate material typically has a thickness of 10 um to 200 um.

The adhesive material includes a binder and an initiator. Under the action of light or heat, the initiator causes a crosslinking reaction of the binder, thereby significantly increasing the adhesion of the adhesive material.

The binder may include any one or more of an acrylic resin, an epoxy resin, a urethane resin, and the like. The initiator may include any one or more of azobisisobutyronitrile, benzophenone, fluorescein, and eosin. The initiator is not limited thereto.

Figure 2:
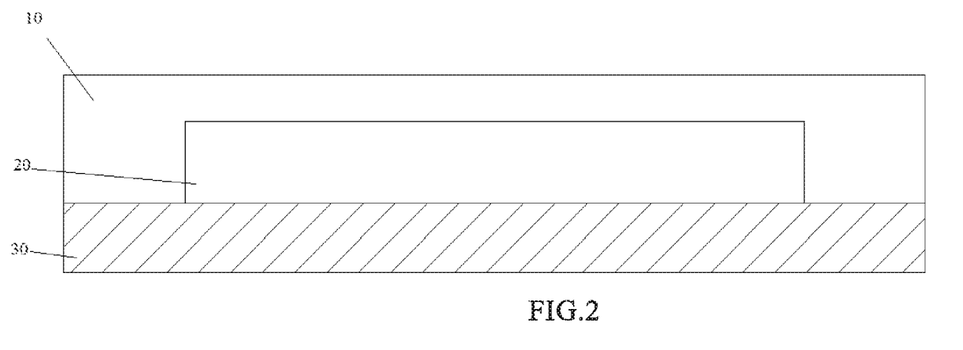
FIG. 2 is a schematic diagram of a structure of a flexible display panel according to an embodiment of the present disclosure.

As shown in FIG. 2, in an embodiment, in order to protect the flexible display substrate 20, at step S11, an upper protective film 10 is further formed on an upper surface (a light-exiting side) of the flexible display substrate 20. The upper protective film 10 is, for example, a protective film having a polyethylene terephthalate (PET) substrate and a polyurethane resin (PU glue).

At step S12, the adhesion-variable back film 30 is cut along a boundary of a to-be-removed region 31. An orthographic projection of the to-be-removed region 31 on the flexible display sub-substrate 21 overlaps with the bending region 21 of the flexible display sub-substrate 21. In an embodiment, a portion of the flexible display sub-substrate 21 overlapping with the to-be-removed region 31 is the bending region 212.

Referring to FIG. 3, each of three to-be-removed regions 31 corresponds to the bending regions 212 of three flexible display sub-substrates 21. The bending region 212 is a portion of the flexible display sub-substrate 21 overlapping with an orthogonal projection of the to-be-removed region 31 on the flexible display sub-substrate 21. An orthographic projection, on the flexible display substrate 20, of the to-be-removed region 31 on the left overlaps with multiple flexible display sub-substrates 21 in the left column; an orthographic projection, on the flexible display substrate 20, of the to-be-removed region 31 in the middle overlaps with multiple flexible display sub-substrates 21 in the middle column; and an orthographic projection, on the flexible display substrate 20, of the to-be-removed region 31 on the right overlaps with multiple flexible display sub-substrates 21 in the right column.

Figure 4:
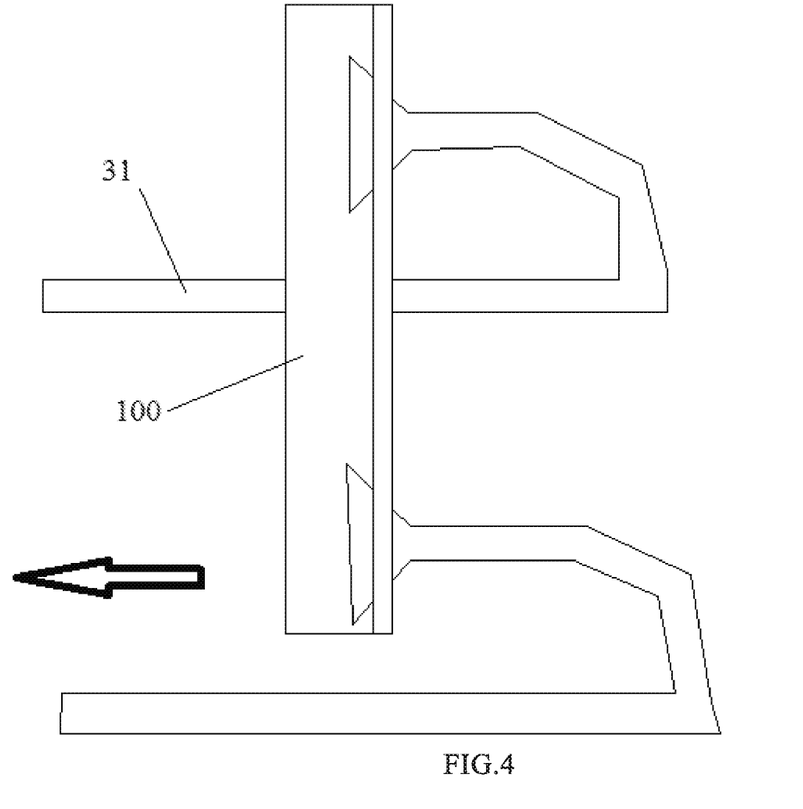
FIG. 4 is a schematic diagram showing a method for removing a to-be-removed region of an adhesion-variable back film according to an embodiment of the present disclosure.

Referring to FIG. 3 and FIG. 4, each of widths of a starting end and a terminating end of the to-be-removed region 31 is greater than a width of a portion of the to-be-removed region 31 corresponding to the bending region 212 of the flexible display sub-substrate 21. In an embodiment, each of widths of the starting end and the terminating end of the to-be-removed region 31 is greater than a width of a portion of the to-be-removed region 31 whose orthogonal projection on the flexible display sub-substrate 21 overlaps with the flexible display sub-substrate 21. The reason for such an arrangement is described later.

At step S13, the adhesion-variable back film 30 in the to-be-removed region 31 is removed, such that the bending region 212 of the flexible display sub-substrate 21 is exposed.

For example, as shown in FIG. 4, the starting ends at a same side of the adhesion-variable back film 30 in two to-be-removed regions 31 are adhered onto a strip-shaped mechanical structure 100, the starting ends are clamped and fixed, and the starting ends at the same side of the adhesion-variable back film 30 in the two to-be-removed regions 31 are lifted up together by the mechanical structure 100 at the same time, thereby improving the removal efficiency of the to-be-removed regions 31. The arrow direction in FIG. 4 represents a movement direction of the mechanical structure 100.

The starting end with a wider width described above facilitates increasing an area of the starting end clamped by the mechanical structure 100 and thus increasing clamping stability. In addition, since the upper protective film 10 is beyond an edge of the flexible display substrate 20, the adhesion-variable back film 30 may also go beyond the edge of the flexible display substrate 20 to be aligned with the upper protective film 10, so that the end portions (e.g., the starting end and the terminating end) of the to-be-removed region 31 are in contact with the upper protective film 10, and the middle portion of the to-be-removed region 31 is in contact with the flexible display substrate 20. The adhesion between the adhesion-variable back film 30 and the upper protective film 10 is different from the adhesion between the adhesion-variable back film 30 and the flexible display substrate 20. The adhesion between the adhesion-variable back film 30 and the flexible display substrate 20 is larger, while the adhesion between the adhesion-variable back film 30 and the upper protective film 10 is smaller. The adhesion or adhesion strength between the upper protective film 10 and the adhesion-variable back film 30 is generally less than 10 gf/inch, and the adhesion strength between the flexible display substrate 20 and the adhesion-variable back film 30 is generally less than 100 gf/inch. In order to stabilize the removal process, the end portion (i.e., the starting end or a terminating end) of the to-be-removed region 31 which is in contact with the upper protective film 10 should be wider. For example, in a case where the removal process is performed by the mechanical structure 100 applying a constant peeling force, a peeling speed does not change a lot, and the peeling process is relatively stable.

In an embodiment, the adhesion-variable back film 30 in the to-be-removed regions 31 can be removed one by one. In an embodiment, the adhesion-variable back film 30 in three or more to-be-removed regions 31 may be removed simultaneously. In addition, the adhesion-variable back film 30 in the to-be-removed region 31 can be removed in other ways. The disclosure is not limited thereto.

Figure 9:
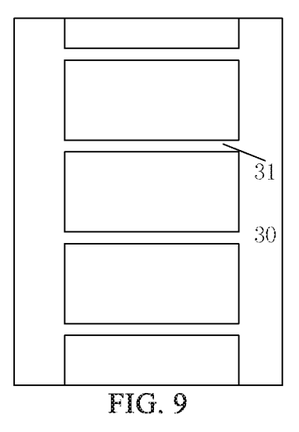
FIG. 9 is a schematic diagram of a to-be-removed region of an adhesion-variable back film according to an embodiment of the present disclosure.

In an embodiment, as shown in FIG. 9, multiple to-be-removed regions 31 of the adhesion-variable back film 30 can be integrally formed with two edges of adhesion-variable back film 30, so that the removal of the to-be-removed regions 31 can be achieved by one peeling operation.

At step S14, a lower protective film 40 is adhered on a surface of the adhesion-variable back film 30 distal to the flexible display sub-substrate 21.

Figure 5:
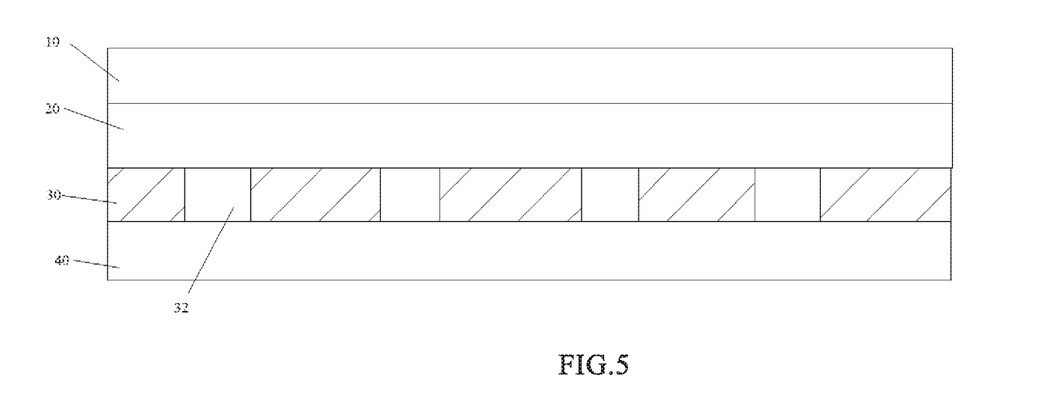
FIG. 5 is a cross-sectional view of a flexible display panel according to an embodiment of the present disclosure.

As shown in FIG. 5, the lower protective film 40 (which will be removed in the subsequent process for manufacturing the flexible display panel) is used for protecting the adhesion-variable back film 30. In some embodiments, the lower protective film 40 is not adhered.

At step S15, the adhesion-variable back film 30 is processed to increase the adhesion of adhesion-variable back film 30.

In a case that the adhesion-variable back film 30 is made of a material which has increased adhesion as being heated, the adhesion-variable back film 30 is heated at step S15. For example, the adhesion-variable back film 30 is heated for 20 minutes at a temperature of 80° C. so as to enhance the adhesion of the adhesion-variable back film 30.

In the case that the adhesion-variable back film 30 is made of a material which has increased adhesion as being irradiated with particular light (for example, UV light), the adhesion-variable back film 30 is irradiated with the particular light at step S15. For example, the adhesion-variable back film 30 is irradiated with UV light having energy of 1000 to 5000 mJ/cm$^2$, for example, 3,000 mJ/cm$^2$, so that the adhesion of the adhesion-variable back film 30 is increased to 1 kg/inch or more.

Since the adhesion between the adhesion-variable back film 30 and the flexible display substrate 20 is sufficiently large, the adhesion-variable back film 30 and the flexible display substrate 20 may not be easily separated, thereby ensuring the sufficient stability of the product.

In the method for manufacturing the flexible display panel according to the present disclosure, the to-be-removed region 31 can be removed as a whole in the semi-finished stage of the flexible display panel. Unlike the related art in which the small-sized back film is adhered after the flexible display sub-substrate 21 is obtained by cutting the flexible display substrate 20, the adhesion-variable back film 30 has been formed on the non-light-exiting side of the flexible display substrate 20 in the semi-finished stage according to the disclosure. Therefore, the method for manufacturing the flexible display panel according to the present disclosure has advantages such as simple manufacturing process, high manufacturing efficiency, and less equipment requirements.

An embodiment of the disclosure provides a method for manufacturing a flexible display device, the method may include: manufacturing a flexible display panel by using the method for manufacturing a flexible display panel according to the disclosure. In addition, the method for manufacturing a flexible display device according to an embodiment of the disclosure further includes steps S16 to S18.

At step S16, a flexible display sub-panel (also called a Panel or a Cell) is obtained by cutting the flexible display panel (also referred to as a Q-Panel). For example, one flexible display substrate can be cut into one or more flexible display sub-substrates. One flexible display sub-panel corresponds to one flexible display sub-substrate 21.

At step S17, the driving circuit 60 is bonded to the bonding region 213 of the flexible display sub-substrate 21, and an upper functional film 50 is adhered to the light-exiting surface of the flexible display sub-substrate 21 in the display region 211, as shown in FIG. 6.

The examples of the driving circuit 60 include a flexible printed circuit board (FPC), a driving chip, or the like. The examples of the upper functional film 50 include a polarizer, a touch substrate, or the like.

In the case where the above-described upper protective film 10 is formed on the flexible display sub-substrate 21, the upper protective film 10 needs to be removed before the upper functional film 50 is adhered.

At step S18, the flexible display sub-substrate 21 is bent in the bending region 212 of the flexible display sub-substrate 21, so that the bonding region 213 is adhered on the non-light-exiting side of the display region 211 of the flexible display sub-substrate 21.

Referring to FIG. 7, the flexible display sub-substrate 21 is bent in the bending region 212 of the flexible display sub-substrate 21, and then a back surface of the bonding region 213 of the flexible display sub-substrate 21 is adhered to a back surface of the display region 211 of the flexible display sub-substrate 21 through an adhesive such as a double-sided tape. The product status after step S18 is finished is shown in FIG. 7.

In an embodiment, in the case where the lower protective film 40 is adhered on the surface of the adhesion-variable back film 30 distal to the flexible display sub-substrate 21, the step of bending the bending region 212 of the flexible display sub-substrate 21 such that the bonding region 213 is adhered on a non-light-exiting side of the display region 211 may include:

First, removing the lower protective film 40; then adhering the lower functional film 70 onto the back surface (i.e., the surface of the adhesion-variable back film 30 distal to the flexible display sub-substrate 21) of the adhesion-variable back film 30 in the display region 211; finally, bending the flexible display sub-substrate 21 in the bending region of the flexible display sub-substrate, such that the back surface (i.e., the surface of the adhesion-variable back film 30 in the bonding region 213 distal to the flexible display sub-substrate 21) of the adhesion-variable back film 30 in the bonding region 213 is adhered with the lower functional film 70, as shown in FIG. 8.

In an embodiment, the lower functional film may include a heat sink, such as a graphite sheet.

In an embodiment, the adhesion-variable back film 30 in the bonding region 213 of the flexible display sub-substrate 21 and the adhesion-variable back film 30 in the display region 211 of the flexible display sub-substrate 21 are not directly adhered together, but indirectly adhered together with the lower functional film 70 disposed therebetween.

It should be noted that step S17 as a whole or a part of step S17 may also be performed after step S18. In some embodiments, the bending of the flexible display sub-substrate 21 and the adhesion between the display region 211 and the bonding region 213 of the flexible display sub-substrate 21 may be performed first, and then the forming of the upper functional film 50 or the bonding of the driving circuit 60 may be performed. In some embodiments, the upper functional film 50 may not be adhered.

The method for manufacturing the flexible display panel according to the present disclosure has the advantages such as simple manufacturing process, high manufacturing efficiency, and less equipment requirements.

An embodiment of the present disclosure provides a flexible display panel manufactured by the above-described method for manufacturing a flexible display panel. As shown in FIG. 5 and FIG. 6, the flexible display panel includes a flexible display substrate 20 and a back film 30 formed on a non-light-exiting surface of the flexible display substrate 20. The flexible display substrate 20 includes at least one flexible display sub-substrate 21. Each flexible display sub-substrate 21 includes a display region 211, a bending region 212 and a bonding region 213, and the bending region 212 is located between the display region 211 and the bonding region 213. The back film 30 is made of an adhesion-variable material, the adhesion of which may be changed (for example, increased) under excitation of an external environment. A notch 32 is provided at a position of the back film 30 corresponding to the bending region 212 of the flexible display sub-substrate 21.

In an embodiment, the adhesion-variable back film 30 is made of a material which has increased adhesion as being heated. In another embodiment, the adhesion-variable back film 30 is made of a material which has increased adhesion as being irradiated with particular light.

The flexible display panel has the advantages such as simple manufacturing process, high manufacturing efficiency, and less equipment requirements.

An embodiment of the present disclosure provides a flexible display device, as shown in FIG. 6, which includes a flexible display sub-panel. The flexible display sub-panel includes a flexible display sub-substrate 21 and a back film disposed on a non-light-exiting surface of the flexible display sub-substrate 21. The flexible display sub-substrate 21 includes a display region 211, a bending region 212, and a bonding region 213. The bending region 212 is between the display region 211 and the bonding region 213. The back film 30 is made of an adhesion-variable material the adhesion of which has been increased under excitation of an external environment. A notch 32 is provided at a position of the back film 30 corresponding to the bending region 212 of the flexible display sub-substrate 21.

In an embodiment, as shown in FIG. 7, the bonding region 213 of the flexible display sub-substrate 21 is adhered on a non-light-exiting side of the display region 211 of the flexible display sub-substrate 21.

The flexible display sub-substrates 21 have been bent before leaving the factory; or the flexible display sub-substrate 21 may be bent by a user.

In an embodiment, the flexible display device further includes a lower functional film 70 that is located on the non-light-exiting surface of the adhesion-variable back film 30 in the display region 211. In an embodiment, the lower functional film may include a heat sink, such as a graphite sheet.

The adhesion-variable back film 30 of the flexible display sub-substrate 21 in the bonding region 213 is indirectly adhered with the adhesion-variable back film 30 of the flexible display sub-substrate 21 in the display region 211 with the lower functional film 70 therebetween. In an embodiment, the adhesion-variable back film 30 in the bonding region 213 of the flexible display sub-substrate 21 is directly adhered to the back surface of the adhesion-variable back film 30 in the display region 211 of the flexible display sub-substrate 21 or adhered to the back surface of the lower functional film on the adhesion-variable back film 30.

In an embodiment, the adhesion-variable back film 30 is made of a material which has increased adhesion as being heated, or the adhesion-variable back film 30 is made of a material which has increased adhesion as being irradiated with particular light. The flexible display device has the advantages such as simple manufacturing process, high manufacturing efficiency, and less equipment requirements.

The flexible display device can be any product or component having a flexible display function, such as an organic light-emitting diode (OLED) display module, a mobile phone, or the like.

It should be understood that the above implementations are merely exemplary embodiments for the purpose of illustrating the principle of the disclosure. However, the present disclosure is not limited thereto. It will be apparent to those skilled in the art that various changes and modifications can be made without departing from the spirit and essence of the present disclosure, and the changes and modifications are also to be regarded as falling within the scope of the present disclosure.

What is claimed is:

1. A method for manufacturing a flexible display panel, the method comprising:
   forming an adhesion-variable back film on a non-light-exiting surface of a flexible display substrate, wherein the flexible display substrate comprises a plurality of flexible display sub-substrate, each of the flexible display sub-substrates comprising a display region, a bonding region, and a bending region between the display region and the bonding region, the bending region being a region to be bent of each of the flexible display sub-substrates;
   cutting the adhesion-variable back film along a boundary of a to-be-removed region, wherein an orthogonal projection of the to-be-removed region on the flexible display substrate overlaps the bending region of each of at least two flexible display substrates of the plurality of flexible display sub-substrates;
   removing the adhesion-variable back film in the to-be-removed region; and
   increasing adhesion of the adhesion-variable back film to obtain the flexible display panel.

2. The method according to claim 1, wherein
   the adhesion-variable back film is made of a material, which has increased adhesion as being heated, and
   increasing the adhesion of the adhesion-variable back film comprises: heating the adhesion-variable back film.

3. The method according to claim 1, wherein
   the adhesion-variable back film is made of a material, which has increased adhesion as being irradiated with particular light, and
   increasing the adhesion of the adhesion-variable back film comprises: irradiating the adhesion-variable back film with the particular light.

4. The method according to claim 1, wherein a width of an end portion of the to-be-removed region is greater than a width of a portion of the to-be-removed region whose orthogonal projection on the flexible display sub-substrate overlaps with the flexible display sub-substrate.

5. The method according to claim 1, wherein
   the adhesion-variable back film comprises a plurality of to-be-removed regions,
   removing the adhesion-variable back film in the to-be-removed region comprises:
   simultaneously removing the adhesion-variable back film in the to-be-removed regions.

6. The method according to claim 5, wherein simultaneously removing the adhesion-variable back film in the to-be-removed regions comprises: adhering end portions, at a same side, of the adhesion-variable back film in the to-be-removed regions to a strip-shaped mechanical structure, and then simultaneously lifting up the end portions.

7. The method according to claim 1, wherein after removing the adhesion-variable back film in the to-be-removed region and before increasing the adhesion of the adhesion-variable back film, the method further comprises:
adhering a lower protective film on a side of the adhesion-variable back film distal to the flexible display substrate.

8. The method according to claim 1, further comprising forming an upper protective film on a light-exiting surface of the flexible display substrate.

9. The method according to claim 8, wherein the upper protective film is beyond an edge of the flexible display substrate to be in contact with the adhesion-variable back film, and
adhesion between the adhesion-variable back film and the flexible display substrate is greater than adhesion between the adhesion-variable back film and the upper protective film.

10. A method for manufacturing a flexible display device, comprising:
manufacturing a flexible display panel according to the method of claim 1;
cutting the flexible display panel to obtain at least one flexible display sub-panel, each flexible display sub-panel comprising one flexible display sub-substrate and the adhesion-variable back film on the non-light-exiting surface of the flexible display sub-substrate; and
bending the flexible display sub-substrate in the bending region of the flexible display sub-substrate, such that the bonding region of the flexible display sub-substrate is adhered on a non-light-exiting side of the display region of the flexible display sub-substrate.

11. The method according to claim 10, further comprising:
bonding a driving circuit in the bonding region of the flexible display sub-substrate; and
adhering an upper functional film to a light-exiting surface of the flexible display sub-substrate in the display region.

12. The method according to claim 11, wherein
the upper functional film comprises at least one of a polarizer and a touch substrate.

13. The method according to claim 11, wherein
an upper protective film is formed on the light-exiting surface of the flexible display sub-substrate; and
before adhering the upper functional film to the light-exiting surface of the flexible display sub-substrate in the display region, the method further comprises:
removing the upper protective film.

14. The method according to claim 10, wherein
a lower protective film is adhered on a side of the adhesion-variable back film distal to the flexible display sub-substrate, and
bending the flexible display sub-substrate in the bending region of the flexible display sub-substrate such that the bonding region of the flexible display sub-substrate is adhered on the non-light-exiting side of the display region of the flexible display sub-substrate comprises:
removing the lower protective film;
adhering a lower functional film on a side of the adhesion-variable back film distal to the flexible display sub-substrate, the lower functional film being in the display region of the flexible display sub-substrate and comprising a heat sink; and
bending the flexible display sub-substrate in the bending region of the flexible display sub-substrate, such that the bonding region of the flexible display sub-substrate is adhered onto the lower functional film.

* * * * *